(12) United States Patent
Choi

(10) Patent No.: US 7,829,392 B2
(45) Date of Patent: Nov. 9, 2010

(54) METHOD FOR MANUFACTURING FUSE BOX HAVING VERTICALLY FORMED PROTECTIVE FILM

(75) Inventor: Ki Soo Choi, Goyang-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 256 days.

(21) Appl. No.: 11/819,859

(22) Filed: Jun. 29, 2007

(65) Prior Publication Data
US 2008/0020560 A1    Jan. 24, 2008

(30) Foreign Application Priority Data
Jul. 24, 2006    (KR) .................. 10-2006-0069207

(51) Int. Cl.
*H01L 21/82* (2006.01)
(52) U.S. Cl. .................. 438/132; 438/215; 257/529
(58) Field of Classification Search .............. 438/132, 438/215, 333; 257/529
See application file for complete search history.

(56) References Cited

U.S. PATENT DOCUMENTS

| | | | |
|---|---|---|---|
| 5,879,966 A * | 3/1999 | Lee et al. | ................ 438/132 |
| 6,831,349 B2 | 12/2004 | Chuang | |
| 6,864,124 B2 * | 3/2005 | Lee et al. | ................ 438/132 |
| 2005/0142834 A1 * | 6/2005 | Lee | ................ 438/601 |
| 2005/0161766 A1 | 7/2005 | Sato et al. | |

FOREIGN PATENT DOCUMENTS

| | | |
|---|---|---|
| CN | 1467839 | 1/2004 |
| KR | 10-2001-0045387 A | 6/2001 |
| KR | 10-2002-0005853 A | 1/2002 |

OTHER PUBLICATIONS

Office Action issued on Jan. 16, 2009, from the State Intellectual Property Office of the People's Republic of China in related Chinese patent application No. 200710136306X.
Notice of Rejection issued from the Korean Intellectual Property Office on Jun. 17, 2008, in counterpart Korean Application No. 10-2006-0069207.

* cited by examiner

*Primary Examiner*—Asok K Sarkar
*Assistant Examiner*—Julia Slutsker
(74) *Attorney, Agent, or Firm*—IP & T Group LLP

(57) ABSTRACT

A method for manufacturing a fuse box of a semiconductor device includes forming an interlayer dielectric film over a semiconductor substrate including a given lower structure; forming a metal line and a fuse over the interlayer dielectric film; forming a first protective film over the resulting structure; etching the first protective film and the fuse at a given depth by a photo-etching process with a repair mask to form an open region; and forming a second protective film vertical to the fuse.

8 Claims, 3 Drawing Sheets

METHOD FOR MANUFACTURING FUSE BOX HAVING VERTICALLY FORMED PROTECTIVE FILM

CROSS-REFERENCES TO RELATED APPLICATIONS

The present application claims the benefit of priority to Korean patent application number 10-2006-0069207, filed on Jul. 24, 2006, the entire contents of which are incorporated herein by reference.

BACKGROUND

The present invention relates generally to a method for manufacturing a fuse box of a semiconductor device, and more specifically to a method for manufacturing a fuse box of a semiconductor device, wherein a metal layer is used as a fuse.

Generally, a semiconductor manufacturing process includes fabrication, electrical die sorting, assembly, and tests.

The fabrication process generally includes performing diffusion, photo-etching, and thin film processes repeatedly to form electric circuits, thereby obtaining a product electrically operable on a wafer.

If a photo-etching process of a protective layer is finished, an electric die sorting process is performed.

The electric die sorting process includes sorting defective chips through an electric characteristic test of each chip formed over a wafer.

The electric die sorting process includes a pre-laser test, a laser repair process, a post-laser test, and a back grinding process.

The pre-laser test includes examining chips of the wafer to select defective chips, and generating data.

The laser repair process includes repairing a repairable chip by a laser beam based on data generated from the pre-laser test.

The laser repair process includes cutting a fuse connected to a defective cell by a laser beam, and replacing the defective cell with a redundancy cell.

The fuse is used to disconnect the defective cell when each bit of a memory cell fails, and to drive the redundancy cell.

The post-laser test includes examining chips repaired in the wafer.

The back grinding process includes polishing the other surface of the wafer with a diamond wheel.

When a metal layer used as a fuse is cut, a laser having a high energy may be required. In order to regulate the energy, the fuse is formed to have a deposition structure including a lower barrier layer, an aluminum (Al) layer, and an upper barrier layer.

When an etching process is performed to open the fuse, the upper barrier layer of the fuse is etched.

However, a step difference is generated between the fuse and an interlayer dielectric film.

A slope is generated because the fuse is not vertically etched, and the upper portion of the fuse is not uniform.

The step difference causes scattered reflection of the laser wavelength in a repair process.

Due to the increase of laser energy, a blowing region is formed larger than a fuse open region, the peripheral fuse has a bridge and a crack in blowing.

SUMMARY

Various embodiments of the present invention are directed to providing a method for manufacturing a fuse box of a semiconductor device, which includes forming a protective film vertical to a fuse, thereby preventing scattered reflection of a laser wavelength in a repair process.

According to an embodiment consistent with the present invention, a method for manufacturing a fuse box of a semiconductor device comprises: forming an interlayer dielectric film over a semiconductor substrate including a given lower structure; forming a metal line and a fuse over the interlayer dielectric film; forming a first protective film over the resulting structure; etching the first protective film and the fuse at a given depth by a photo-etching process with a repair mask to form an open region; and forming a second protective film vertical to the fuse.

DETAILED DESCRIPTION

The present invention will be described in detail with reference to the accompanying drawings.

Figure 1:
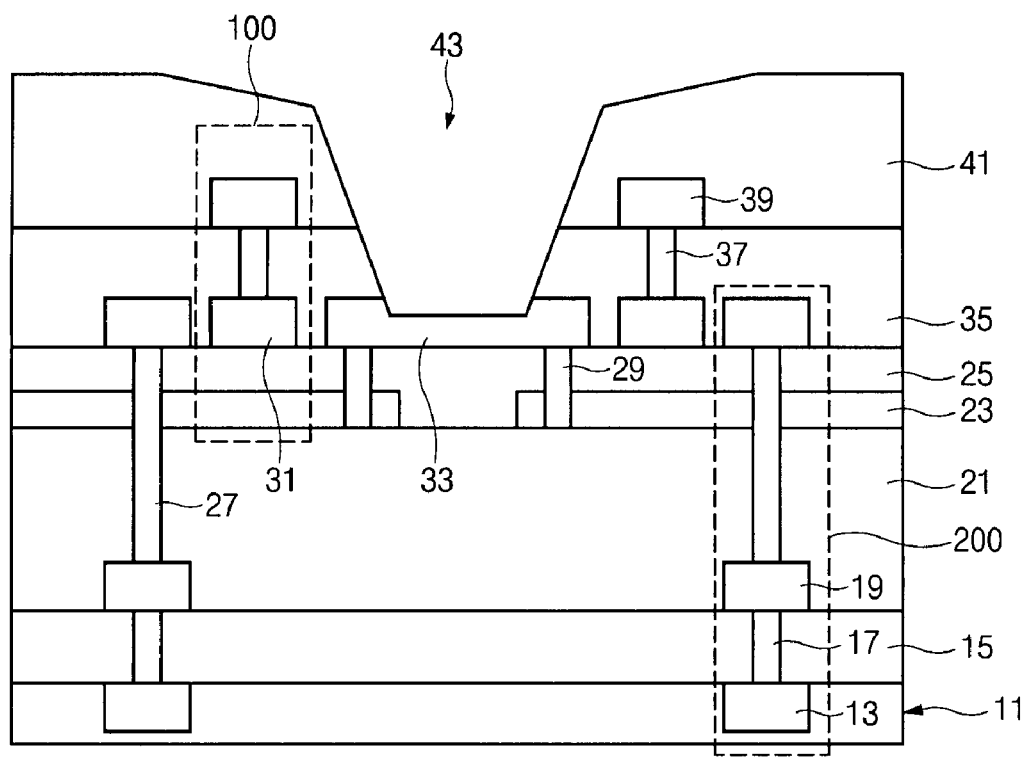
FIG. 1 is a cross-sectional diagram illustrating a fuse box of a semiconductor device according to an embodiment consistent with the present invention.

FIG. 1 is a cross-sectional diagram illustrating a fuse box of a semiconductor device according to an embodiment consistent with the present invention.

An active region 13 is formed in a semiconductor substrate 11. A first interlayer dielectric film 15 including a contact plug 17 for bit line is formed over the semiconductor substrate 11.

A bit line 19 connected to contact plug 17 is formed over first interlayer dielectric film 15.

A second interlayer dielectric film 21 is formed over bit line 19, and a plate layer 23 is formed over second interlayer dielectric film 21.

Plate layer 23 has a given region which is etched and disconnected.

A third interlayer dielectric film 25 is formed to cover plate layer 23.

A contact plug 27 for a first metal line connected to bit line 19 through third interlayer dielectric film 25 and second interlayer dielectric film 21 is formed. A contact plug 29 for a fuse connected to plate layer 23 through third interlayer dielectric film 25 is formed.

A first metal line 31 and a fuse 33 are formed over third interlayer dielectric film 25.

Fuse 33 is formed to have a deposition structure including a lower barrier layer, a metal layer and an upper barrier layer.

A fourth interlayer dielectric film 35 is formed over first metal line 31 and fuse 33.

Fourth interlayer dielectric film 35 is formed to have a deposition structure including a layer for protecting a metal layer of fuse 33, an insulating film for gap fill, and an etching barrier layer.

A contact plug 37 for a second metal line connected to first metal line 31 through fourth interlayer dielectric film 35 is formed.

A second metal line 39 is formed over fourth interlayer dielectric film 35, and a first protective film 41 is formed over metal line 39.

First protective film 41, fourth interlayer dielectric film 35, and fuse 33 are etched with a repair mask to form a fuse open region 43.

A first guardring structure 100 includes first metal line 31, contact plug 37, and second metal line 39. A second guardring structure 200 includes active region 13, contact plug 17, bit line 19, contact plug 27, and first metal line 31.

First guardring structure 100 and second guardring structure 200 protect an oxidation phenomenon of peripheral circuits by moisture absorption.

A second protective film 45 (shown in FIG. 3a) may be formed over the first protective film 41 including fuse open region 43. The second protective film will be explained later.

A repair process is performed with a laser to cut the fuse corresponding to a cell having a defect.

Figure 2:
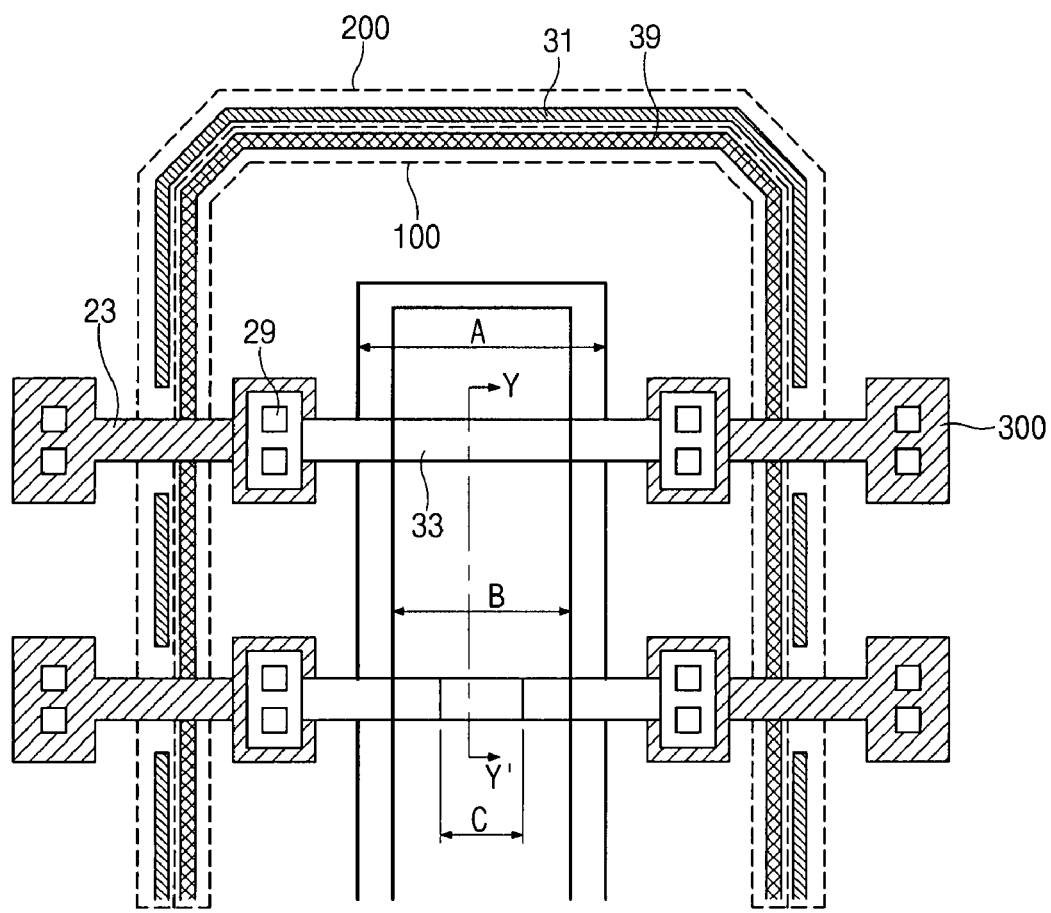
FIG. 2 is a cross-sectional diagram illustrating a fuse box of a semiconductor device according to an embodiment consistent with the present invention.

FIG. 2 is a plane diagram illustrating a fuse box of a semiconductor device according to an embodiment consistent with the present invention.

As shown in FIG. 2, first guardring structure 100 and second guardring structure 200 surround fuse 33.

Contact plug 29 for connecting plate layer 23 to both ends of fuse 33 is formed.

Fuse 33 is connected to the peripheral circuit unit (not shown) through plate layer 23 connected to a pad 300.

Fuse 33 is not connected directly to the peripheral circuit unit, because first metal line 31 forms first guardring structure 100.

Fuse 33 has a size C, which is smaller than a size B of the repair mask, and size B is smaller than a size A of the fuse mask.

Figure 3A:
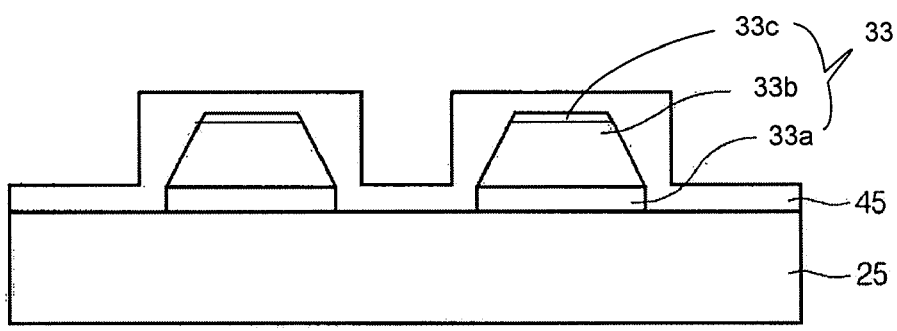
FIG. 3a is a cross-sectional diagram illustrating a fuse box of a semiconductor device according to an embodiment consistent with the present invention.
Figure 3B:
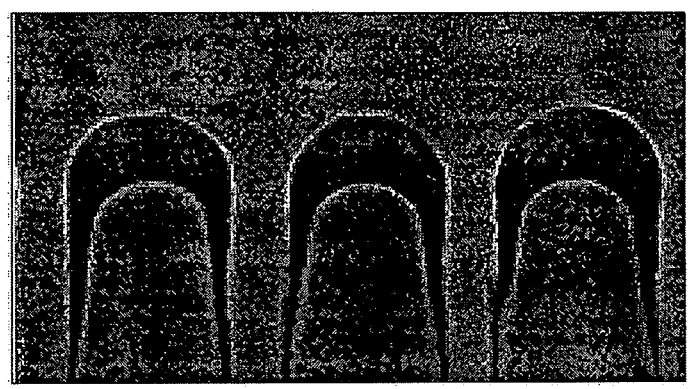
FIG. 3b is a photo-diagram illustrating a fuse box of a semiconductor device according to an embodiment consistent with the present invention.

FIGS. 3a and 3b are respectively a cross-sectional diagram and a photo-diagram illustrating a fuse box of a semiconductor device according to an embodiment consistent with the present invention.

Fuse 33 is formed to have a deposition structure including a lower barrier layer 33a, a metal layer 33b, and an upper barrier layer 33c over third interlayer dielectric film 25.

Lower barrier layer 33a and the upper barrier layer may include a Ti layer and a TiN layer, respectively.

Metal layer 33b may include an Al layer.

The upper barrier layer and a part of metal layer 33b are etched or all of the upper barrier layer and metal layer 33b are etched, to form fuse open region 43.

The thickness of lower barrier layer 33a can be adjusted in consideration of loss by a dry etching process.

A second protective film 45 is formed on fuse 33 in fuse open region 43 (shown in FIG. 3a).

Second protective film 45 may include an un-doped silicate glass (USG) film.

USG film is formed at a temperature below a melting point of metal layer 33b, for example, less than a temperature of about 400° C. when metal layer 33b includes an Al layer, under a pressure of about 2.1~2.3 Torr, at a high frequency (HF) power of about 990~1010 W, for a time period of about 2.51~2.78 sec, with a $SiH_4$ gas of about 290~310 sccm, an $N_2O$ gas of about 8500~10500 sccm, and an $N_2$ gas of about 1490~1510 sccm. FIG. 3b shows a USG film formed at a temperature of about 400° C., under a pressure of about 2.2 Torr, at a HF power of about 1000 W, for a time period of about 2.658 sec, with a $SiH_4$ gas of about 300 sccm, an $N_2O$ gas of about 9500 sccm, and an $N_2$ gas of about 1500 sccm.

When the upper barrier layer of fuse 33 and metal layer 33b are etched to have a trapezoid shape, second protective film 45 is formed vertical to fuse 33. As a result, the scattered reflection of the laser wavelength can be prevented in the repair process.

A distance between fuses 33 can be reduced, thereby decreasing the area of the fuse box.

As described above, according to an embodiment consistent with the present invention, a method for manufacturing a fuse box of a semiconductor device includes forming a protective film vertical to a metal fuse to prevent scattered reflection of a laser wavelength and a bridge of peripheral fuses in a repair process. As a result, a distance between metal fuses can be reduced, and the area of the fuse box unit can be decreased.

The above embodiments consistent with the present invention are illustrative and not limitative. Various alternatives and equivalents are possible. The invention is not limited by the lithography steps described herein. Nor is the invention limited to any specific types of semiconductor devices. For example, the present invention may be implemented in a dynamic random access memory (DRAM) device or a non-volatile memory device. Other additions, subtractions, or modifications are obvious in view of the present disclosure and are intended to fall within the scope of the appended claims.

What is claimed is:

1. A method for manufacturing a fuse box of a semiconductor device, the method comprising:
   forming an interlayer dielectric film over a semiconductor substrate including a predetermined lower structure;
   forming a metal line and a fuse over the interlayer dielectric film resulting in a fuse structure, wherein a cross section of layers of the fuse has a trapezoid shape;
   forming a first protective film over the fuse structure;
   etching the first protective film and the fuse to a predetermined depth by a photo-etching process with a repair mask, thereby forming an open region; and
   forming a second protective film on the fuse exposed by the open region, wherein the second protective film covering the fuse includes a protruding portion, sides of the protruding portion being vertical to a top of the fuse and a top of the protruding portion being horizontal to the top of the fuse.

2. The method according to claim 1, wherein the fuse comprises a lower barrier layer, a metal layer, and an upper barrier layer.

3. The method according to claim 2, wherein forming the open region comprises etching the upper barrier layer and a part of the metal layer.

4. The method according to claim 2, wherein forming the open region comprises etching the upper barrier layer and the metal layer of the fuse.

5. The method according to claim 2, wherein the lower barrier layer and the upper barrier layer respectively comprise a Ti layer and a TiN layer.

6. The method according to claim 2, wherein the metal layer comprises an aluminum (Al) layer.

7. The method according to claim 1, wherein the second protective film comprises an un-doped silicate glass (USG) film.

8. The method according to claim 7, wherein the USG film is formed at a temperature below a melting point of the fuse.

* * * * *